United States Patent
Nagaishi et al.

[19]

[11] Patent Number: 6,157,190
[45] Date of Patent: Dec. 5, 2000

[54] DETECTING EQUIPMENT FOR DETECTING MAGNETIC MINUTE SUBSTANCE IN AN OBJECT TO BE INSPECTED

[75] Inventors: Tatsuoki Nagaishi; Hirokazu Kugai; Hideo Itozaki, all of Hyogo, Japan

[73] Assignee: Sumitomo Electric Industries, Ltd., Osaka, Japan

[21] Appl. No.: 08/880,554

[22] Filed: Jun. 23, 1997

[30] Foreign Application Priority Data

Jun. 21, 1996 [JP] Japan ..................................... 8-181171

[51] Int. Cl.[7] .......................... G01N 27/82; G01N 27/90; G01R 33/12; G01R 33/035
[52] U.S. Cl. ............................................ 324/242; 324/235
[58] Field of Search .................................... 324/239, 240, 324/226, 228, 235, 248, 242, 243, 262

[56] References Cited

U.S. PATENT DOCUMENTS

| | | | |
|---|---|---|---|
| 3,854,085 | 12/1974 | Mansson et al. | 324/37 |
| 3,975,934 | 8/1976 | Voigt et al. | 324/34 SC |
| 4,734,643 | 3/1988 | Bubenik et al. | 324/226 |
| 5,589,772 | 12/1996 | Kugai | 324/240 |
| 5,729,135 | 3/1998 | Kugai | 324/240 |

FOREIGN PATENT DOCUMENTS 0 634 652  1/1995  European Pat. Off. .

OTHER PUBLICATIONS

Cochran, A. et al., "First–generation SQUID–based nondestructive testing system," IEE Proceedings–A, vol. 140, No. 2, pp. 113–120 (Mar. 1993).

Cochran, A. et al., "SQUIDS for NDT: The Technology and its Capabilities," British Journal of Non–Destructive Testing, vol. 35, No. 4, pp. 173–182 (Apr. 1993).

Primary Examiner—Walter E. Snow
Attorney, Agent, or Firm—Foley & Lardner

[57] ABSTRACT

The present invention relates to a detecting apparatus for detecting a magnetic minute substance. The detecting apparatus of the present invention can detect continually at a high sensitivity an entity of fine particle, without destroying an object to be inspected. The detecting apparatus comprises a magnetic field generator and a magnetic sensor. The magnetic field generator generates a magnetic field having a right angle to the traveling direction of the object to be inspected. The magnetic sensor includes a SQUID for inspecting a drift of the magnetic field that is parallel to the magnetic field.

2 Claims, 4 Drawing Sheets

DETECTING EQUIPMENT FOR DETECTING MAGNETIC MINUTE SUBSTANCE IN AN OBJECT TO BE INSPECTED

BACKGROUND OF THE INVENTION

1. Field of the Invention

The present invention relates to a detecting apparatus for detecting a magnetic minute substance. More specifically, the detecting apparatus of the present invention can detect continually at a high sensitivity an entity of fine particles, without destroying an object to be inspected having the shape of a wire or a rod.

2. Description of the Related Art

Foreign matter contained in a long material is a possible cause of serious trouble, even if the foreign matter is very small. For example, Cu is a wire material used as an electric conductor. Some times, it is thinned to less than 100 $\mu$m in diameter. However, Cu runs out on an elongated process, when a foreign matter of less than 10 $\mu$m is contained in the Cu material. As another example, when foreign matter of less than 10 $\mu$m exists in its isolation coating, proof pressure of a cable line conveying power at a high voltage of 500 kV significantly deteriorates.

A method for detecting foreign matter in a material using electromagnetic induction is known. However, this method only can detect foreign matter more than approximately 100 $\mu$m. Accordingly, small foreign matter less than 100 $\mu$m cannot be detected. A new method that can detect smaller foreign matter is desired.

For this technical subject, the applicant has filed a patent application relating to a new detecting apparatus, namely U.S. patent application Ser. No. 08/273,433.

This apparatus detects a drift of a magnetic field that includes an object to be inspected caused by the existence of foreign matter. This equipment comprises a SQUID (Superconducting Quantum Interference Device) as a magnetic sensor having very high sensitivity. Accordingly, the output signal of the SQUID is affected by a drift of the environmental magnetic field. The circumference of the SQUID and the object to be inspected is surrounded with a magnetic shield container, and detection of the magnetic substance is done inside of the magnetic shield container. The magnetic shield container may be made of a permalloy for example.

However, when an object to be inspected is a very long object, like a wire, the object to be inspected cannot be accommodated in a magnetic shield container. Then, the detection is enforced while the object to be inspected is carried in and out of the magnetic shield container. In other words, during detection, the object to be inspected is introduced at one end of the magnetic shield container and carried out from the other end of the magnetic shield container simultaneously. Accordingly, a pair of openings needs to be made in the magnetic shield container. The object to be inspected is carried in and out through these openings.

However, immersion of outside magnetic field must be prevented from invading the magnetic shield container through the openings. In the patent application, a magnetic shield container having a special shape is used for inspecting a long object to be inspected and immersion of the outside magnetic field is prevented by the shape of the container.

But, it is difficult to produce a magnetic shield container having a complicated shape. At the same time, it is difficult to handle the container because the complicated shape complicates the operation of inserting a long material.

SUMMARY OF THE INVENTION

A purpose of the present invention is to provide a detecting apparatus having high detectivity and that is easy to use.

The detecting apparatus of the present invention comprises a magnetic field generation means and a magnetic sensor.

The magnetic field generation means generates a magnetic field and an object to be inspected runs inside of the magnetic field along a direction of its overall length. Then, the object to be inspected is magnetized.

The magnetic sensor comprises a SQUID as a part of a magnetic sensor. The magnetic sensor is arranged in the neighborhood of a traveling path of the object to be inspected and after the magnetic field generation means. When a magnetic substance is contained in the object to be inspected, the magnetic field changes. The magnetic sensor detects the change of the magnetic field by the SQUID.

In the apparatus of the present invention, the magnetic field generation means generates a magnetic field that is at a right angle to the traveling direction of the object to be inspected. Accordingly, the object to be inspected is magnetized at a right angle to the traveling direction. On the other hand, the sensitivity of the magnetic sensor is highest in a specific direction.

When the magnetic sensor consists of individual SQUID only, the direction that detectivity becomes highest is the direction that is at a right angle to the formation surface of the SQUID. When the magnetic sensor comprises a SQUID and a flux transformer, the direction is the direction that is at a right angle to the plane that includes the pickup coil of the flux transformer.

These two configurations are major characteristics of the present invention. In the detecting apparatus of the present invention, the object to be inspected is magnetized before being inspected by the magnetic sensor. Accordingly, a magnetic minute substance in a object to be inspected is magnetized in specified direction too. As a result, the requirement to provide a magnetic shield container is moderated.

A typical application of the detecting apparatus of the present invention is as a check in the manufacturing process of wire-rod material. In this field, it is understood that most of the foreign matter in an object is fine iron particle. In the detecting apparatus of the present invention, first, an object to be inspected runs inside of a magnetic field generated by the magnetic field generation means and next passes in the neighborhood of the magnetic sensor. A magnetic substance contained in the object to be inspected is magnetized by the magnetic field corresponding to each peculiar characteristic magnetic susceptibility. When magnetized foreign matter passes in a magnetic field, the magnetic field experiences a drift. And, the magnetic sensor detects a drift of the magnetic field. This is the principle of operation of the apparatus of the present invention.

Thus, the apparatus of the present invention can detect extremely minute magnetic substances in high sensitivity. According to a desirable embodiment of the present invention, detection by the SQUID is carried out in the magnetic shield container. The magnetic shield container defines a range covered from intercepting of the outer magnetic field. The inner magnetic field is not disturbed by drift of the environment magnetic field. The magnetic shield container can be made of Permalloy, for example.

In addition, when an object to be inspected is a long material, an opening for object to be inspected to pass is established in the magnetic shield container. Furthermore, when the long material is running in succession while being inspected, the inside diameter of the openings must be larger than the diameter of the object to be inspected. However, when the inside diameter of the openings is too large, the outside magnetic field invades into the container through the openings. This is never desirable of course.

For this matter, the apparatus of the present invention comprises a characteristic structure. In the detecting apparatus of the present invention, an object to be inspected is magnetized in a peculiar direction before being detected by the magnetic sensor. Namely, magnetization is done in a magnetic field that is at a right angle to the traveling direction of the object to be inspected. Accordingly, the magnetic sensor detects a drift of the magnetic field that is at a right angle to the traveling direction of the object to be inspected. On the other hand, the magnetic field that invades from the openings is parallel to the traveling direction of the object to be inspected. Accordingly, any effect of an outside magnetic field can be eliminated effectively by a magnetic shield container of simple configuration.

According to another embodiment of the present invention, the apparatus of the present invention comprises several magnetic sensors. Each magnetic sensor is located so that spacing from an object to be inspected to each magnetic sensor is different mutually. Each magnetic sensor exhibits a unique output. The output of each magnetic sensor corresponds to a constant magnetic field and to spacing between the object to be inspected and each magnetic sensor. Accordingly, the true drift can be detected from the difference between outputs of the magnetic sensors. Thus, the effect of the outside magnetic field can be eliminated.

Some noise to be generated by the SQUID itself exists furthermore, and the output of the SQUID contains this type of noise, too. It is desirable to use a filter for elimination of the noise. A filter is inserted between the signal processing circuit and the output device. The filter only lets pass a signal with specified frequency bandwidth.

According to another embodiment, the SQUID as a magnetic sensor can be made of an oxide superconducting thin film. Because oxide superconducting thin film has a high superconducting critical temperature, it becomes a superconductor by cooling off with liquid nitrogen. Liquid nitrogen is inexpensive, and feeding of liquid nitrogen is stable. Accordingly, the running cost of the magnetic sensor with a SQUID made of a superconducting thin film is low, and manipulation of SQUID in operation is easy.

As described in detail mentioned above, the present invention realizes the following benefit. This apparatus can detect extremely minute magnetic substance of minute dozens of $\mu$m dimension from an object to be inspected running in succession. Accordingly, a gross quantity check in the manufacturing process of a long material can be enforced.

The present invention will be understood furthermore by the following descriptions referring to the figures.

DETAILED DESCRIPTION OF THE DRAWINGS

Figure 1:
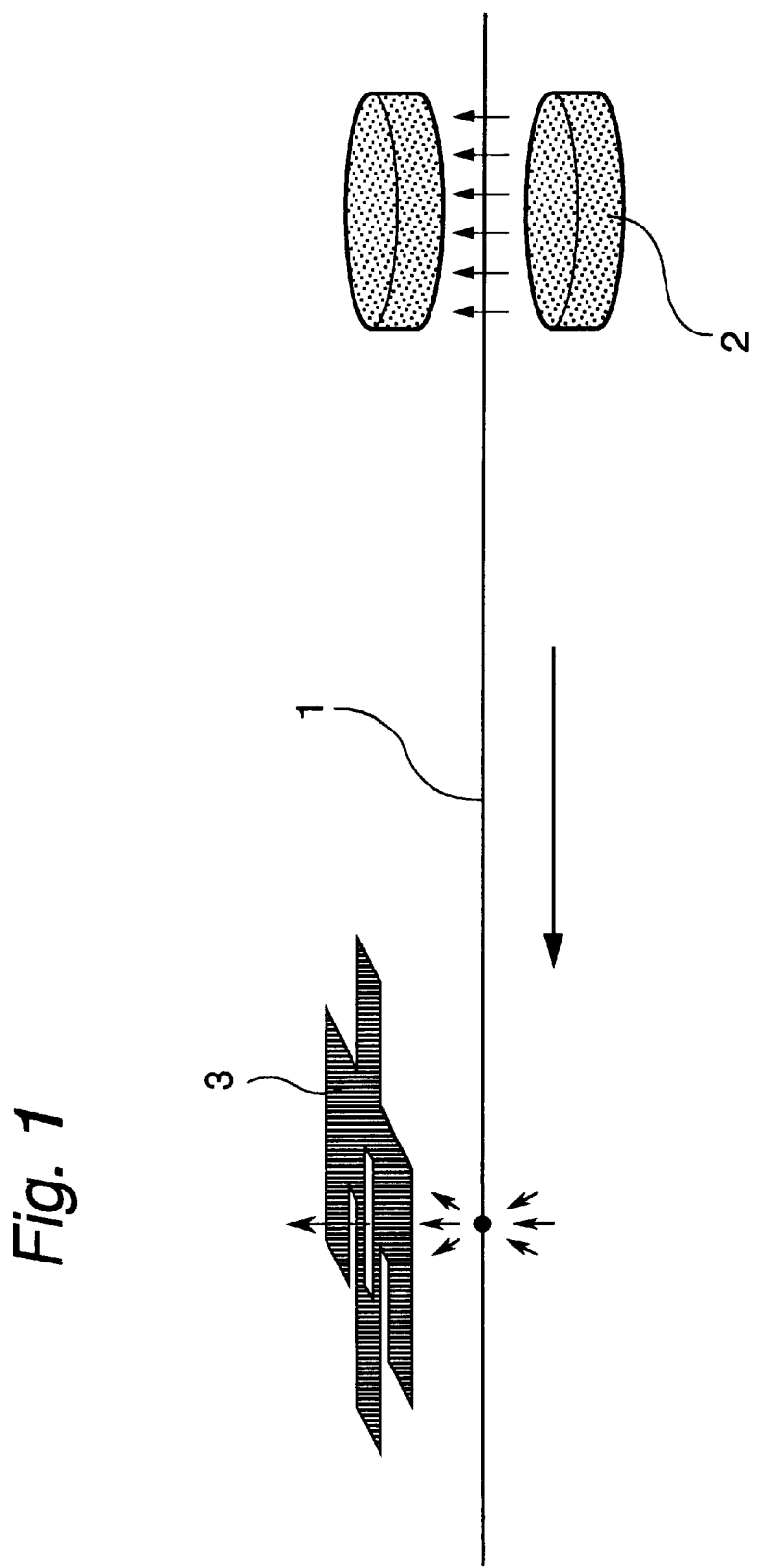
FIG. 1 is a schematic figure of the basic framing of the detecting apparatus of the present invention.

The principle of operation of the detecting apparatus of the present invention will now be explained referring FIG. 1.

An object to be inspected 1 is a long material and travels along a constant path. The detecting apparatus possesses a magnetic field generation means 2 and a magnetic sensor 3 arranged along the object to be inspected 1. The magnetic field generation means 2 generates a constant magnetic field at a right angle to the traveling direction of the object to be inspected 1.

At first, the object to be inspected 1 passes through the inside of the magnetic field. When a magnetic substance is contained in the object to be inspected 1, the magnetic substance is magnetized according to its magnetic susceptibility while passing inside of the magnetic field. Next, the object to be inspected 1 passes near to the magnetic sensor 3 comprising a SQUID. The SQUID is formed on a plane at a right angle to the magnetic field.

When no magnetic substance is contained in the object to be inspected 1, the SQUID outputs a constant signal corresponding to the magnetic susceptibility of the object to be inspected 1. When a magnetic substance is contained in the object to be inspected 1, the magnetic field is changed by the magnetized substance, and the output voltage of the SQUID changes. The SQUID is a very sensitive to detect a drift of a magnetic field. Accordingly, a magnetic minute substance can be detected.

Embodiment 1

Figure 2:
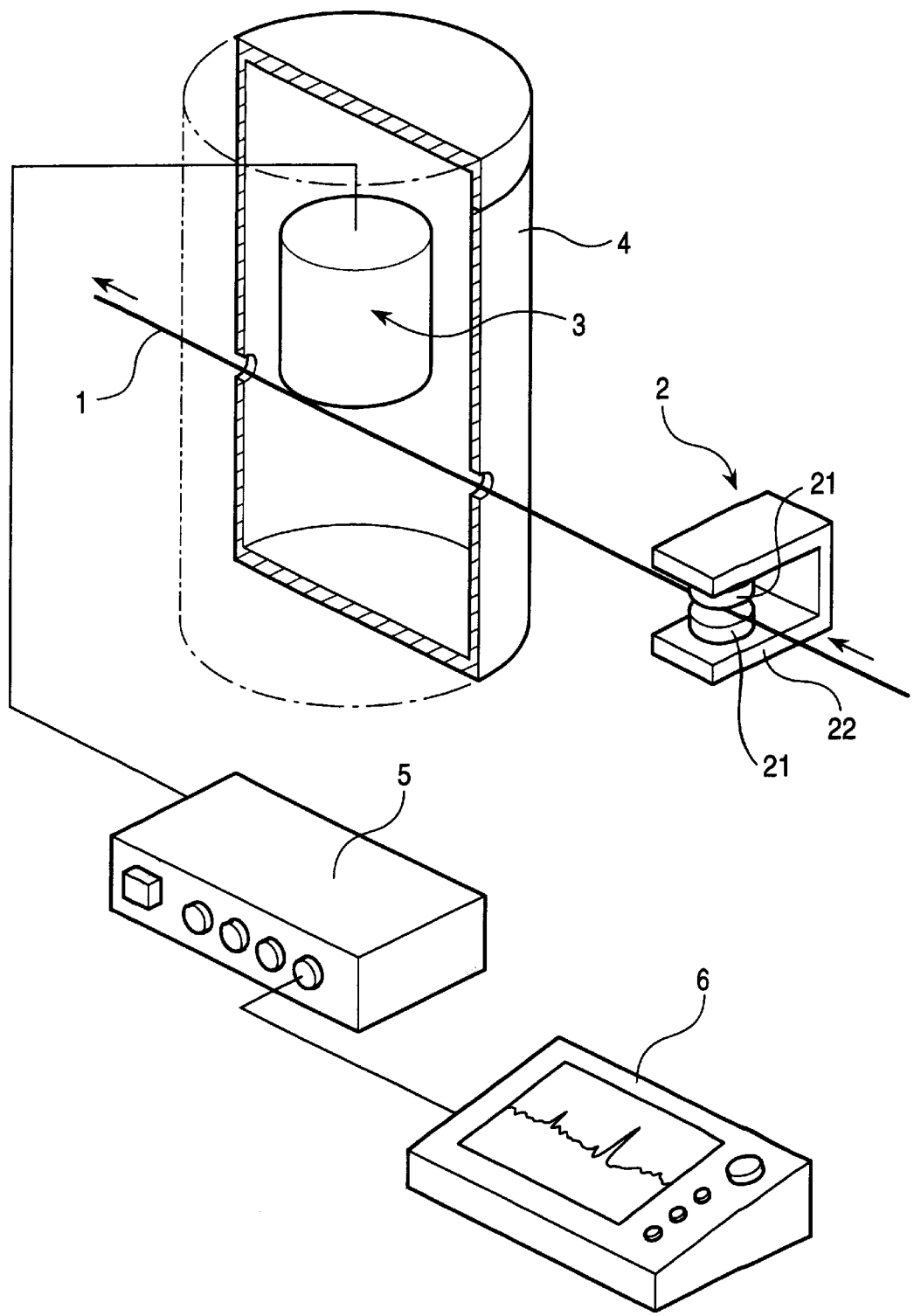
FIG. 2 is a schematic figure showing the concrete construction of the detecting apparatus of the present invention.

FIG. 2 shows one embodiment of a concrete framing of the detecting apparatus of the present invention. The reference numbers of FIG. 2 that refer to common elements in FIG. 1 are the same in FIG. 2 as those used in FIG. 1.

This detecting apparatus comprises a magnetic field generation means 2, a magnetic sensor 3 and a magnetic shield container 4.

The magnetic field generation means 2 comprises a pair of permanent magnets 21 and a yoke 22. The yoke 22 puts together permanent magnet 21 magnetically. A magnetic field from one permanent magnet to another permanent magnet is generated.

The magnetic sensor consists of a heat insulation container 34 and a SQUID that is arranged horizontally on the base of the heat insulation container. The heat insulation container 34 is met with a cooling medium. The SQUID is placed parallel to the traveling direction of the object to be inspected. At the same time, the SQUID is arranged at a right angle to the magnetic field generated by the magnetic field generation means, because the magnetic flux running through the SQUID becomes maximum. The SQUID functions as a magnetic sensor with high sensitivity.

The magnetic shield container 4 encloses the magnetic sensor 3 and a part of the object to be inspected that is traveling near the magnetic sensor 3. The magnetic shield container 4 eliminates jamming by the environmental magnetic field to the magnetic sensor 3.

The output signal of the magnetic sensor 3 is communicated to signal processing equipment 5 that is based on an FLL (flux locked loop) circuit. Furthermore, a pen recorder 6 as a recording device is mounted to the signal processing equipment 5.

Figure 3:
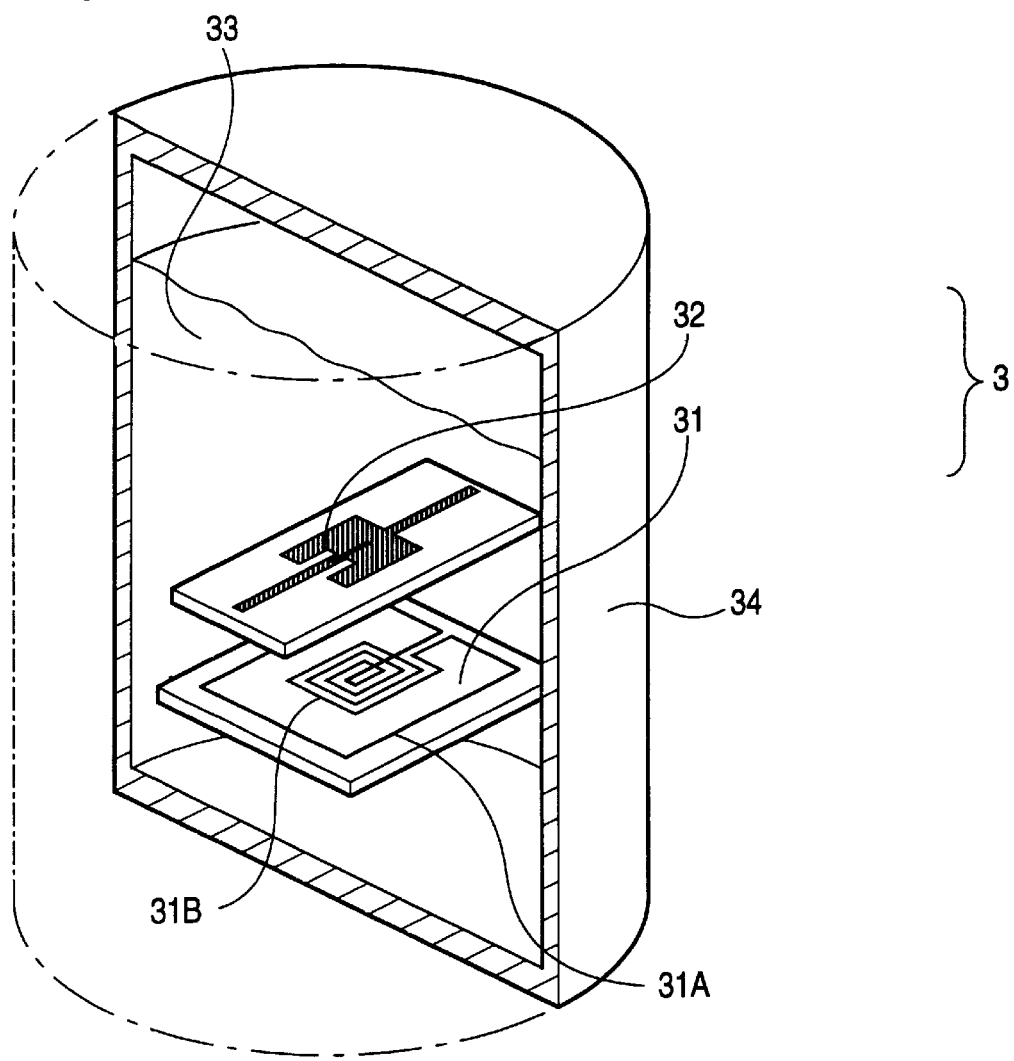
FIG. 3 is a schematic figure showing the construction of a usable magnetic sensor in the detecting apparatus of the present invention.

One embodiment of the magnetic sensor that can be used as the magnetic sensor 3 is shown in FIG. 3.

By the way, a SQUID without another attached device functions as a magnetic sensor. However, sensitivity of the SQUID as a magnetic sensor can be improved by using the SQUID with a flux transformer.

The magnetic sensor 3 shown in FIG. 3 comprises a SQUID 32 and a flux transformer 31. The SQUID 32 and the flux transformer 31 are each formed of a superconducting thin film on a substrate. In flux transformer 31, a pickup coil 31A and an input coil 31B are connected to each other. The pickup coil 31A has few windings. By comparison, the input coil 31B has more windings. The center of the input coil 31B and the center of the SQUID 32 accord with each other. Furthermore, the flux transformer 31 and the SQUID 32 are taken into the heat insulation container 34. The heat insulation container 34 is met with a cooling medium 33, for example liquid nitrogen.

In FIG. 3, the SQUID 32 and the flux transformer 31 are drawn separately. However, actually, the SQUID and the flux transformer are cohered to each other, while the superconducting thin film which forms the SQUID 32 is on lower surface of substrate. At the same time, it is preferred to insert an isolation layer between the SQUID 32 and the flux transformer 31 to avoid a short-circuit.

Furthermore, actually, the input coil 31B and the SQUID 32 is exaggerated in FIG. 3. But, their abbreviations are almost the same dimension. On the other hand, the length of the input coil 31B on the bank is around ⅛ of overall length of the pickup coil 31A on the bank. In FIG. 3, delineation is omitted about individual electric wiring.

The magnetic sensor may be changed to a gradiometer. A so called gradiometer comprises a pair of electric coils which have opposite directions to each other. Variation of magnetic field changing in the whole like an environment magnetic field, is denied. Accordingly, in some cases, the magnetic shield container can be omitted.

The detecting apparatus mentioned above has been made.

The SQUID and the flux transformer have been made of $Y_1Ba_2Cu_3O_{7-x}$ thin film deposited on an $SrTiO_3$ substrate and patterned. The weak link department of the SQUID made the pattern breadth of the thin film narrow.

Furthermore, a difference in grade that has a bearing height of 1600 Å was formed on the substrate before depositing the thin film. An artificial grain boundary in the thin film is formed at a place of the difference in grade. The artificial grain boundary contributed to formation of a weak link, too.

The magnetic field generation means was made with permanent magnets and arranged so that the object to be inspected passed in the magnetic field inside of approximately 0.1 tesla. The magnetic field generated was at a right angle to the traveling direction of the object to be inspected.

Furthermore, the input coil of flux transformer was arranged in the plane that was at a right angle to the magnetic flux generated. The input coil was arranged 15 mm apart from the pass of the object to be inspected. It is prefer to sensitivity of the magnetic sensor that the spacing between the object to be inspected and the magnetic. But, actually, by die thickness of the insulation container 34, the spacing was forced to be 15 mm. The magnetic shield container, which is formed with a pair of openings to allow passage of the object to be inspected, was made of permalloy. The openings preferably have diameter of 20 mm and are a simple bore.

We confirmed actuation of the detecting apparatus mentioned above. A polyester line having a diameter of 0.5 mm was prepared. It was confirmed beforehand that the polyester line contains no foreign matter. At the same time, iron powder which has a diameter of 60 µm, 100 µm or 180 µm was prepared. The iron powder was added to the polyester line to form an object to be inspected. The polyester line was inspected by the equipment, while letting the line run at 10 m per second.

Figure 4:
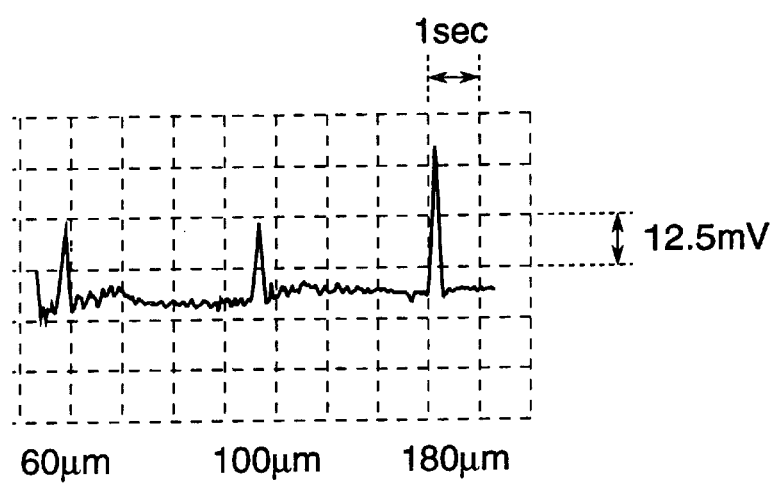
FIG. 4 is a graph of a result of an inspection using the detecting apparatus shown in FIG. 2.

The output of the signal processing equipment 5 was introduced into the pen recorder 6 through a filter. The filter was a lowpass filter having a cut-off frequency of 10 Hz. The pen recorder 6 recorded a measurement result, which is described in FIG. 4.

We could confirm that iron powder having a 60 µm particle size has been detected.

Next, we confirmed the effect by a direction of the magnetic field about disposition of the magnet sensor. At first, components that were the same as the detecting apparatus mentioned above were prepared. Another detecting apparatus for comparing was assembled with these components. However, in the detecting apparatus for comparing, the angle of the permanent magnets of the magnetic field generation means were different. The angle of the permanent magnets were varied 90 degrees from the angle of the magnets in the apparatus of the present invention. Accordingly, the direction of magnetic field was made parallel to the formation surface of the flux transformer and the SQUID.

As a sample, nylon line having a diameter of 0.5 mm was prepared. It was confirmed beforehand that the nylon line itself includes no magnetic substance. Iron powder having a particle size of 500 µm was added to the nylon line.

The nylon line was inspected by the detecting apparatus mentioned above. At the same time, the same sample was inspected by the apparatus of the present invention. As a result, a sensitivity of the present invention was approximately 3 times higher relative to the apparatus for comparing. In other words, the variation of output signal of the magnetic sensor was 3 times as much.

Embodiment 2

Figure 5:
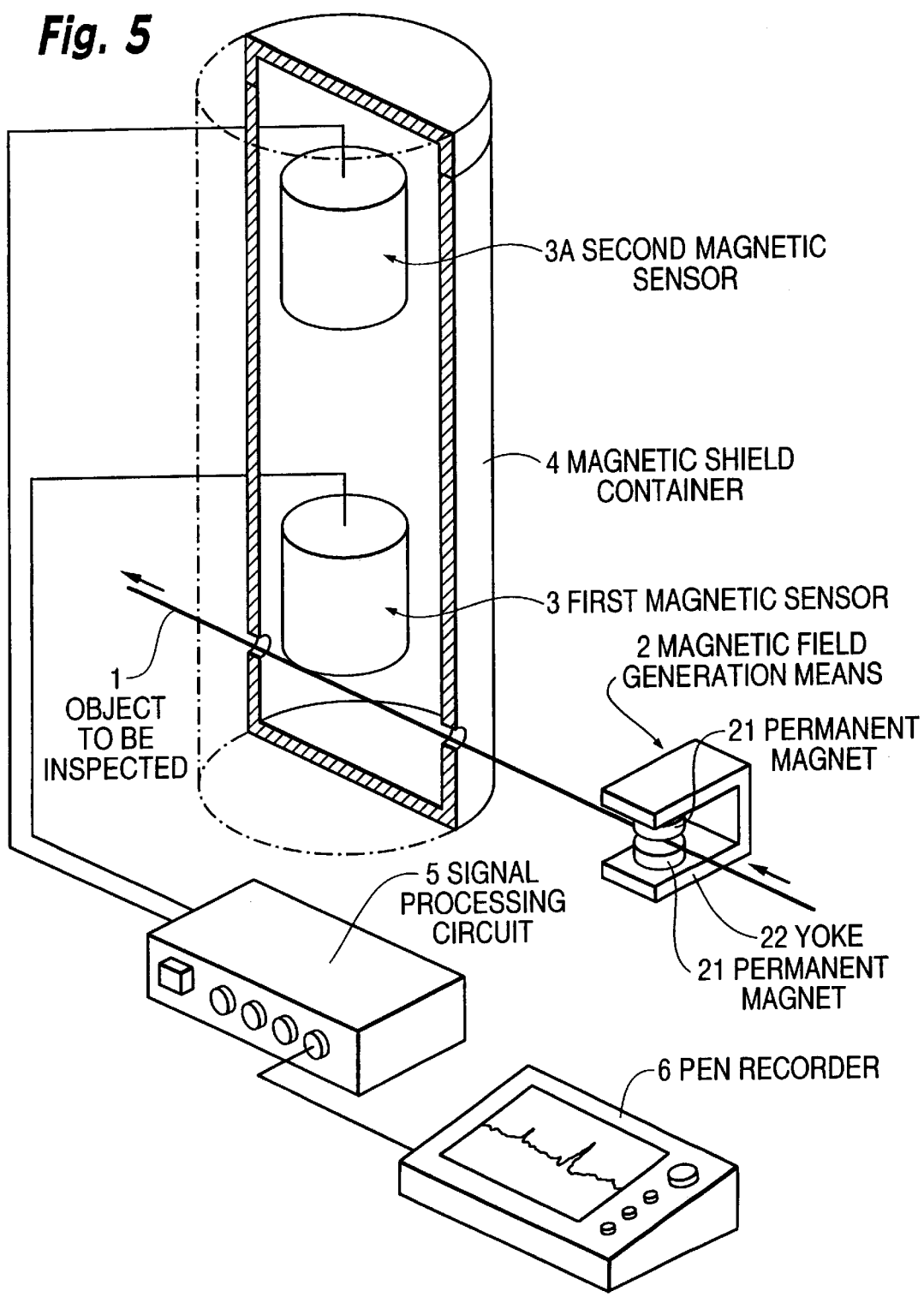
FIG. 5 is a schematic figure of the basic framing of another embodiment of the detecting apparatus of the present invention.

The detecting apparatus of this embodiment, shown in FIG. 5, is different from the equipment of the first embodiment because it has two magnetic sensors 3 and 3A.

The principle of operation of each magnetic sensor is equal to that of the first embodiment. And, each magnetic sensor 3 and 3A has the same construction as the magnetic sensor 3 shown in FIG. 3, too.

The first magnetic sensor 3 is arranged at the same location as the first embodiment. Namely, the first magnetic sensor is located at a position 15 mm away from the object to be inspected. By comparison, the second magnetic sensor 3A is located 100 mm more distant from the object to be inspected than the first magnetic sensor. And the second magnetic sensor 3A is arranged parallel to the first magnetic sensor 3.

The output of the first magnetic sensor and the output of the second magnetic sensor are each output through FLL circuits. The signal processing circuit comprises an operational amplifier receiving outputs of two FLL circuits at its input end. The operational amplifier outputs the difference between the outputs of the two FLL circuits. The output signal of the operational amplifier is processed by the signal processing circuit of the first embodiment in the same way as an output of a magnetic sensor. Such a construction can reduce the effect of the earth's magnetic field and background magnetic field. In some cases, use of the magnetic shield container can be omitted.

Even a detecting apparatus having such a construction was able to detect magnetic substance of minimum 60 µm actually.

In the detecting apparatus having the construction mentioned above, a signal corresponding to the existence of a foreign matter is provided from the output of the first magnetic sensor. The reason is because the intensity of a magnetic field is in inverse proportion to 3 power of distance and because the first magnetic sensor is located near the object to be inspected. In the above-mentioned example, the detectivity of the first magnetic sensor is approximately 450 times of the detectivity of the second magnetic sensor.

By the way, the spacing between the first magnetic sensor and the second magnetic sensor is not limited to 100 mm. A larger distance is preferred so long as other conditions allow, because the signal strength can be lifted. Now, when the spacing between the first magnetic sensor and the object to be inspected is "$X_1$", and the spacing between the second magnetic sensor and the object to be inspected is "$X_2$", the following relationship of expression 1 between the output voltage $S_1$ of the first magnetic sensor and the output voltage $S_2$ of the second magnetic sensor applies.

Expression 1:$S_1/S_2 = (X_1/X_2)^{3.1 \cdot 3}$.

Accordingly, when there is little variation of the output voltage between the magnetic sensors, the detecting equipment can detect a magnetic substance theoretically.

However, actually, it is preferred that the output voltage of one magnetic sensor is more than 2 times of the output voltage of the other magnetic sensor. When the spacing between the first magnetic sensor and the object to be inspected is 15 mm, the spacing of the second magnetic sensor and the object to be inspected satisfying the above-mentioned condition is 19 mm. This value can be obtained from the expression 1.

Comparing

We compared the detecting apparatuses of the first embodiment and the second embodiment.

A copper wire having a diameter of 2.8 mm was prepared as an object to be inspected. First, noise having random frequency was output from magnetic sensor. This noise was generated to correspond to the traveling speed of the object to be inspected, and effective detection could not be completed. A possible cause is because a magnetic substance exists continually in the object to be inspected, and the magnetic sensor detected it. It is believed that the magnetic substance exists in copper as a solid solution.

Next, a band pass filter was inserted at the output of the signal processing circuit 5. The band pass of the filter was fitted to the peak frequency of noise corresponding to the traveling speed of the wire. The conditions of the measurement, including the characteristic of the filter, are shown in the following table.

TABLE

| Object to be inspected | Cu line |
|---|---|
| Speed of the Cu line | 40 m/minute |
| Cut-off frequency of the band pass filter | 20 Hz and 1 Hz |
| Attenuation slope of the filter | 42dB/oct. |

By using the apparatus having the construction mentioned above, fine iron particle of 60 μm was able to be detected. The S/N ratio of the detection was more than 5.

What is claimed is:

1. A detecting apparatus for inspecting an object to be inspected that is a long material moving along a path in a length direction and for detecting a magnetic minute substance contained in the object to be inspected, comprising:

a magnetic field generator that generates a magnetic field at a right angle to the traveling direction of the object to be inspected, said magnetic field generator pre-magnetizing the object to be inspected; and a magnetic sensor located after said magnetic field generator along the path of the object to be inspected, said magnetic sensor including a SQUID for inspecting a drift of the magnetic field of the pre-magnetized object to be inspected, the SQUID being formed in a plane oriented at a right angle to the magnetic field, said magnetic sensor comprising a first magnetic sensor, including said SQUID, that is located near the object to be inspected and a second magnetic sensor that is located further from the object to be inspected than said first magnetic sensor.

2. The detecting apparatus according to claim 1, wherein the difference between an output of said first magnetic sensor and an output of said second magnetic sensor is treated as an output of said magnetic sensor.

* * * * *